(12) United States Patent
Zhao et al.

(10) Patent No.: US 9,628,050 B2
(45) Date of Patent: Apr. 18, 2017

(54) SCAN DRIVING CIRCUIT

(71) Applicant: Wuhan China Star Optoelectronics Technology Co., Ltd., Wuhan (CN)

(72) Inventors: Mang Zhao, Wuhan (CN); Yong Tian, Wuhan (CN); Gui Chen, Wuhan (CN); Caiqin Chen, Wuhan (CN); Xin Zhang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 14/783,100

(22) PCT Filed: Aug. 10, 2015

(86) PCT No.: PCT/CN2015/086487
§ 371 (c)(1),
(2) Date: Oct. 8, 2015

(87) PCT Pub. No.: WO2017/000360
PCT Pub. Date: Jan. 5, 2017

(65) Prior Publication Data
US 2017/0005642 A1    Jan. 5, 2017

(51) Int. Cl.
*H03B 1/00* (2006.01)
*H03K 3/00* (2006.01)
*H03K 3/012* (2006.01)
*G09G 3/36* (2006.01)

(52) U.S. Cl.
CPC .......... *H03K 3/012* (2013.01); *G09G 3/3677* (2013.01); *G09G 2300/0814* (2013.01); *G09G 2310/0202* (2013.01); *G09G 2310/0289* (2013.01)

(58) Field of Classification Search
CPC ...................................................... H03K 3/012
USPC ........................................................ 327/108
See application file for complete search history.

(56) References Cited

U.S. PATENT DOCUMENTS

| | | | |
|---|---|---|---|
| 2011/0150169 A1 | 6/2011 | Lin et al. | |
| 2015/0348596 A1 | 12/2015 | Yao et al. | |
| 2016/0125828 A1 | 5/2016 | Xiao | |
| 2016/0125831 A1 | 5/2016 | Xiao | |
| 2016/0343323 A1 | 11/2016 | Xiao | |

FOREIGN PATENT DOCUMENTS

| | | | |
|---|---|---|---|
| CN | 104021750 | 9/2014 | |
| CN | 104409054 | 3/2015 | |
| CN | 104464659 | 3/2015 | |
| CN | 104464663 | 3/2015 | |
| CN | 104464663 A | * 3/2015 | .......... G09G 3/3696 |
| CN | 104700799 | 6/2015 | |

* cited by examiner

*Primary Examiner* — Lincoln Donovan
*Assistant Examiner* — Metasebia Retebo

(57) ABSTRACT

A scan driving circuit configured for driving cascaded scan lines is provided, which includes an input control module, a latch module, a driving-signal generation module, an output control module, a constant high voltage source and a constant low voltage source. The scan driving circuit of the present invention drives the input control module through cascade signals of a preceding stage and cascade signals of a succeeding stage, so as to reduce interference and the driving power consumption of the scan driving circuit.

18 Claims, 3 Drawing Sheets

SCAN DRIVING CIRCUIT

RELATED APPLICATIONS

This application is a National Phase of PCT Patent Application No. PCT/CN2015/086487 having International filing date of Aug. 10, 2015, which claims the benefit of priority of Chinese Patent Application No. 201510386937.1 filed on Jul. 2, 2015. The contents of the above applications are all incorporated by reference as if fully set forth herein in their entirety.

FIELD OF THE INVENTION

The present invention relates to the technical field of display driving, and in particular to a scan driving circuit.

BACKGROUND OF THE INVENTION

A gate driver on array, called GOA for abbreviation, has a scan driving circuit manufactured on an array substrate of a conventional thin-film transistor liquid crystal display for performing the progressive scan driving on scanning lines.

However, it is required for a conventional scan driving circuit to use the clock signals (CK) and the cascade signals of the previous stage (Q_N−1). Since the cascade signals of the previous stage are subject to the interference of the clock signal (CK), the normal display driving is influenced. Moreover, the fluctuation of the cascade signals of the preceding stage (Q_N−1) causes the extra power consumption of the scan driving circuit.

Therefore, it is necessary to provide a scan driving circuit, in order to solve the problems of the prior art.

SUMMARY OF THE INVENTION

A primary object of the present invention is to provide a scan driving circuit with a simple structure and low power consumption for resolving the technical problem of the high dynamic power consumption of a conventional scan driving circuit.

To achieve the above object, the present invention provides a technical solution as follows:

A scan driving circuit is provided for driving cascaded scan lines, which includes:

An input control module inputted with a first clock signal of a current stage, cascade signals of a preceding stage, and cascade signals of a succeeding stage, and for generating a control signal based upon the first clock signal of the current stage, the cascade signals of the preceding stage, and the cascade signals of the succeeding stage;

A latch module for performing a latch operation for the control signal;

A driving-signal generation module for generating a driving signal based upon the control signal and a second clock signal of the current stage;

An output control module for outputting a scanning signal of the current stage based upon the driving signal;

A constant high voltage source for providing high voltage; and

A constant low voltage source for providing low voltage,

Wherein an inverted signal of the control signal is used as cascade signals of the current stage and outputted into the scan driving circuit of the succeeding stage;

Wherein the input control module includes a 19th switching transistor, a 20th switching transistor, a 21st switching transistor, a 22nd switching transistor, a 23rd switching transistor, and a 24th switching transistor, Wherein a control end of the 19th switching transistor is connected with an output end of the driving-signal generation module, an input end of the 19th switching transistor is connected with the constant high voltage source, and an output end of the 19th switching transistor is connected with a control end of the 21st switching transistor and a control end of the 22nd switching transistor, Wherein a control end of the 20th switching transistor is connected with the output end of the driving-signal generation module, an input end of the 20th switching transistor is connected with the constant low voltage source, and an output end of the 20th switching transistor is connected with the control end of the 21st switching transistor and the control end of the 22nd switching transistor, Wherein an input end of the 21st switching transistor is connected with the constant high voltage source, and an output end of the 21st switching transistor is connected with a control end of the 23rd switching transistor and a control end of the 24th switching transistor, Wherein an input end of the 22nd switching transistor is connected with the constant low voltage source, and an output end of the 22nd switching transistor is connected with the control end of the 23rd switching transistor and the control end of the 24th switching transistor, Wherein an input end of the 23rd switching transistor is connected with the constant high voltage source, and an output end of the 23rd switching transistor is connected with an output end of the output control module, Wherein an input end of the 24th switching transistor is connected with the constant low voltage source, and an output end of the 24th switching transistor is connected with the output end of the input control module, Wherein the 19th switching transistor, the 21st switching transistor and the 23rd switching transistor are PMOS transistors, and the 20th switching transistor, the 22nd switching transistor and the 24th switching transistor are NMOS transistors.

In the scan driving circuit in accordance with an embodiment of the present invention, the input control module includes a 1st switching transistor, a 2nd switching transistor, a 3rd switching transistor, a 4th switching transistor, a 5th switching transistor and a 6th switching transistor, Wherein a control end of the 1st switching transistor is inputted with the first clock signal of the current stage, an input end of the 1st switching transistor is connected with the constant high voltage source, and an output end of the 1st switching transistor is connected with an output end of the input control module, Wherein a control end of the 2nd switching transistor is inputted with the cascade signals of the preceding stage, an input end of the 2nd switching transistor is connected with the constant high voltage source, and an output end of the 2nd switching transistor is connected with an input end of the 3rd switching transistor, Wherein a control end of the 3rd switching transistor is inputted with the cascade signals of the succeeding stage, and an output end of the 3rd switching transistor is connected with the output end of the input control module, Wherein a control end of the 4th switching transistor is inputted with the first clock signal of the current stage, an input end of the 4th switching transistor is connected with an output end of the 5th switching transistor, and an output end of the 4th switching transistor is connected with the output end of the input control module, Wherein a control end of the 5th switching transistor is inputted with the cascade signals of the preceding stage, and an input end of the 5th switching transistor is connected with the constant low voltage source, Wherein a control end of the 6th switching transistor is inputted with the cascade signals of the succeeding stage, an input end of the 6th switching transistor is connected with the constant low voltage source, and an output end of the 6th switching transistor is connected with the output end of the 5th switching transistor.

In the scan driving circuit in accordance with an embodiment of the present invention, the 1st switching transistor, the 2nd switching transistor and the 3rd switching transistor are PMOS transistors, and the 4th switching transistor, the 5th switching transistor and the 6th switching transistor are NMOS transistors.

In the scan driving circuit in accordance with an embodiment of the present invention, the input control module includes a 1st switching transistor, a 2nd switching transistor, a 3rd switching transistor, a 4th switching transistor, a 5th switching transistor and a 6th switching transistor, Wherein a control end of the 1st switching transistor is inputted with the first clock signal of the current stage, an input end of the 1st switching transistor is connected with the constant high voltage source, and an output end of the 1st switching transistor is connected with an output end of the input control module, Wherein a control end of the 2nd switching transistor is inputted with the cascade signals of the preceding stage, an input end of the 2nd switching transistor is connected with the constant high voltage source, and an output end of the 2nd switching transistor is connected with an input end of the 3rd switching transistor, Wherein a control end of the 3rd switching transistor is inputted with the cascade signals of the succeeding stage, and an output end of the 3rd switching transistor is connected with the output end of the input control module, Wherein a control end of the 4th switching transistor is inputted with the first clock signal of the current stage, an input end of the 4th switching transistor is connected with the constant low voltage source, and an output end of the 4th switching transistor is connected with an input end of the 5th switching transistor, Wherein a control end of the 5th switching transistor is inputted with the cascade signals of the preceding stage, and an output end of the 5th switching transistor is connected with the output end of the input control module, Wherein a control end of the 6th switching transistor is inputted with the cascade signals of the succeeding stage, an input end of the 6th switching transistor is connected with the input end of the 5th switching transistor, and an output end of the 6th switching transistor is connected with the output end of the input control module.

Wherein the 1st switching transistor, the 2nd switching transistor and the 3rd switching transistor are PMOS transistors, and the 4th switching transistor, the 5th switching transistor and the 6th switching transistor are NMOS transistors.

In the scan driving circuit in accordance with an embodiment of the present invention, the latch module includes a 1st inverter, a 2nd inverter, a 7th switching transistor, an 8th switching transistor, a 9th switching transistor, a 10th switching transistor, a 11th switching transistor, a 12th switching transistor, a 13th switching transistor and a 14th switching transistor, Wherein a control end of the 7th switching transistor is connected with of an output end of the input control module, an input end of the 7th switching transistor is connected with the constant high voltage source, and an output end of the 7th switching transistor is connected with an input end of the 8th switching transistor, Wherein a control end of the 8th switching transistor is inputted with the cascade signals of the preceding stage, and an output end of the 8th switching transistor is connected with an output end of the latch module through the 2nd inverter, Wherein a control end of the 9th switching transistor is inputted with the cascade signals of the preceding stage, and an output of the 9th switching transistor is connected with the output end of the latch module through the 2nd inverter, Wherein a control end of the 10th switch is connected with the output end of the input control module through the 1st inverter, an input end of the 10th switching transistor is connected with the constant low voltage source, and an output end of the 10th switching transistor is connected with an input end of the 9th switching transistor, Wherein a control end of the 11th switching transistor is connected with the output end of the input control module through the 1st inverter, an input end of the 11th switching transistor is connected with the constant high voltage source, and an output end of the 11th switching transistor is connected with an input end of the 12th switching transistor, Wherein a control end of the 12th switching transistor is connected with the output end of the latch module, and an output end of the 12th switching transistor is connected with the output end of the latch module through the 2nd inverter, Wherein a control end of the 13th switching transistor is connected with the output end of the latch module, and an output end of the 13th switching transistor is connected with the output end of the latch module through the 2nd inverter, Wherein a control end of the 14th switching transistor is connected with the output end of the input control module, an input end of the 14th switching transistor is connected with the constant low voltage source, and an output end of the 14th switching transistor is connected with an input end of the 13th switching transistor.

In the scan driving circuit in accordance with an embodiment of the present invention, the 7th switching transistor, the 8th switching transistor, the 11th switching transistor and the 12th switching transistor are PMOS transistors, and the 9th switching transistor, the 10th switching transistor, the 13th switching transistor and the 14th switching transistor are NMOS transistors.

In the scan driving circuit in accordance with an embodiment of the present invention, the driving-signal generation module includes a 15th switching transistor, a 16th switching transistor, a 17th switching transistor and a 18th switching transistor, Wherein a control end of the 15th switching transistor is connected with an output end of the latch module, an input end of the 15th switching transistor is connected with the constant high voltage source, and an output end of the 15th switching transistor is connected with an output end of the driving-signal generation module, Wherein a control end of the 16th switching transistor is inputted with the second clock signal of the current stage, an input end of the 16th switching transistor is connected with the constant high voltage source, and an output end of the 16th switching transistor is connected with the output end of the driving-signal generation module, Wherein a control end of the 17th switching transistor is connected with the output end of the latch module, an input end of the 17th switching transistor is connected with an output end of the 18th switching transistor, and an output end of the 17th switching transistor is connected with the output end of the driving-signal generation module, Wherein a control end of the 18th switching transistor is inputted with the second clock signal of the current stage, and an input end of the 18th switching transistor is connected with the constant low voltage source.

In the scan driving circuit in accordance with an embodiment of the present invention, the scan driving circuit as claimed in claim 8, the 15th switching transistor, the 16th switching transistor are PMOS transistors, and the 17th switching transistor and the 18th switching transistor are NMOS transistors.

A scan driving circuit is provided for driving cascaded scan lines, which includes:

An input control module inputted with a first clock signal of a current stage, cascade signals of a preceding stage, and cascade signals of a succeeding stage, and for generating a control signal based upon the first clock signal of the current stage, the cascade signals of the preceding stage, and the cascade signals of the succeeding stage;

A latch module for performing a latch operation for the control signal;

A driving-signal generation module for generating a driving signal based upon the control signal and a second clock signal of the current stage;

An output control module for outputting a scanning signal of the current stage based upon the driving signal;

A constant high voltage source for providing high voltage; and

A constant low voltage source for providing low voltage.

In the scan driving circuit in accordance with an embodiment of the present invention, the input control module includes a 1st switching transistor, a 2nd switching transistor, a 3rd switching transistor, a 4th switching transistor, a 5th switching transistor and a 6th switching transistor, Wherein a control end of the 1st switching transistor is inputted with the first clock signal of the current stage, an input end of the 1st switching transistor is connected with the constant high voltage source, and an output end of the 1st switching transistor is connected with an output end of the input control module, Wherein a control end of the 2nd switching transistor is inputted with the cascade signals of the preceding stage, an input end of the 2nd switching transistor is connected with the constant high voltage source, and an output end of the 2nd switching transistor is connected with an input end of the 3rd switching transistor, Wherein a control end of the 3rd switching transistor is inputted with the cascade signals of the succeeding stage, and an output end of the 3rd switching transistor is connected with the output end of the input control module, Wherein a control end of the 4th switching transistor is inputted with the first clock signal of the current stage, an input end of the 4th switching transistor is connected with an output end of the 5th switching transistor, and an output end of the 4th switching transistor is connected with the output end of the input control module, Wherein a control end of the 5th switching transistor is inputted with the cascade signals of the preceding stage, and an input end of the 5th switching transistor is connected with the constant low voltage source, Wherein a control end of the 6th switching transistor is inputted with the cascade signals of the succeeding stage, an input end of the 6th switching transistor is connected with the constant low voltage source, and an output end of the 6th switching transistor is connected with the output end of the 5th switching transistor.

In the scan driving circuit in accordance with an embodiment of the present invention, the 1st switching transistor, the 2nd switching transistor and the 3rd switching transistor are PMOS transistors, and the 4th switching transistor, the 5th switching transistor and the 6th switching transistor are NMOS transistors.

In the scan driving circuit in accordance with an embodiment of the present invention, the input control module includes a 1st switching transistor, a 2nd switching transistor, a 3rd switching transistor, a 4th switching transistor, a 5th switching transistor and a 6th switching transistor, Wherein a control end of the 1st switching transistor is inputted with the first clock signal of the current stage, an input end of the 1st switching transistor is connected with the constant high voltage source, and an output end of the 1st switching transistor is connected with an output end of the input control module, Wherein a control end of the 2nd switching transistor is inputted with the cascade signals of the preceding stage, an input end of the 2nd switching transistor is connected with the constant high voltage source, and an output end of the 2nd switching transistor is connected with an input end of the 3rd switching transistor, Wherein a control end of the 3rd switching transistor is inputted with the cascade signals of the succeeding stage, and an output end of the 3rd switching transistor is connected with the output end of the input control module, Wherein a control end of the 4th switching transistor is inputted with the first clock signal of the current stage, an input end of the 4th switching transistor is connected with the constant low voltage source, and an output end of the 4th switching transistor is connected with an input end of the 5th switching transistor, Wherein a control end of the 5th switching transistor is inputted with the cascade signals of the preceding stage, and an output end of the 5th switching transistor is connected with the output end of the input control module, Wherein a control end of the 6th switching transistor is inputted with the cascade signals of the succeeding stage, an input end of the 6th switching transistor is connected with the input end of the 5th switching transistor, and an output end of the 6th switching transistor is connected with the output end of the input control module.

In the scan driving circuit in accordance with an embodiment of the present invention, the 1st switching transistor, the 2nd switching transistor and the 3rd switching transistor are PMOS transistors, and the 4th switching transistor, the 5th switching transistor and the 6th switching transistor are NMOS transistors.

In the scan driving circuit in accordance with an embodiment of the present invention, the latch module includes a 1st inverter, a 2nd inverter, a 7th switching transistor, an 8th switching transistor, a 9th switching transistor, a 10th switching transistor, a 11th switching transistor, a 12th switching transistor, a 13th switching transistor and a 14th switching transistor, Wherein a control end of the 7th switching transistor is connected with of an output end of the input control module, an input end of the 7th switching transistor is connected with the constant high voltage source, and an output end of the 7th switching transistor is connected with an input end of the 8th switching transistor, Wherein a control end of the 8th switching transistor is inputted with the cascade signals of the preceding stage, and an output end of the 8th switching transistor is connected with an output end of the latch module through the 2nd inverter, Wherein a control end of the 9th switching transistor is inputted with the cascade signals of the preceding stage, and an output of the 9th switching transistor is connected with the output end of the latch module through the 2nd inverter;

Wherein a control end of the 10th switch is connected with the output end of the input control module through the 1st inverter, an input end of the 10th switching transistor is connected with the constant low voltage source, and an output end of the 10th switching transistor is connected with an input end of the 9th switching transistor;

Wherein a control end of the 11th switching transistor is connected with the output end of the input control module through the 1st inverter, an input end of the 11th switching transistor is connected with the constant high voltage source, and an output end of the 11th switching transistor is connected with an input end of the 12th switching transistor;

Wherein a control end of the 12th switching transistor is connected with the output end of the latch module, and an output end of the 12th switching transistor is connected with the output end of the latch module through the 2nd inverter;

Wherein a control end of the 13th switching transistor is connected with the output end of the latch module, and an output end of the 13th switching transistor is connected with the output end of the latch module through the 2nd inverter;

Wherein a control end of the 14th switching transistor is connected with the output end of the input control module, an input end of the 14th switching transistor is connected with the constant low voltage source, and an output end of the 14th switching transistor is connected with an input end of the 13th switching transistor.

In the scan driving circuit in accordance with an embodiment of the present invention, the 7th switching transistor, the 8th switching transistor, the 11th switching transistor and the 12th switching transistor are PMOS transistors, and the 9th switching transistor, the 10th switching transistor, the 13th switching transistor and the 14th switching transistor are NMOS transistors.

In the scan driving circuit in accordance with an embodiment of the present invention, the driving-signal generation module includes a 15th switching transistor, a 16th switching transistor, a 17th switching transistor and a 18th switching transistor;

Wherein a control end of the 15th switching transistor is connected with an output end of the latch module, an input end of the 15th switching transistor is connected with the constant high voltage source, and an output end of the 15th switching transistor is connected with an output end of the driving-signal generation module;

Wherein a control end of the 16th switching transistor is inputted with the second clock signal of the current stage, an input end of the 16th switching transistor is connected with the constant high voltage source, and an output end of the 16th switching transistor is connected with the output end of the driving-signal generation module, Wherein a control end of the 17th switching transistor is connected with the output end of the latch module, an input end of the 17th switching transistor is connected with an output end of the 18th switching transistor, and an output end of the 17th switching transistor is connected with the output end of the driving-signal generation module, Wherein a control end of the 18th switching transistor is inputted with the second clock signal of the current stage, and an input end of the 18th switching transistor is connected with the constant low voltage source.

In the scan driving circuit in accordance with an embodiment of the present invention, the 15th switching transistor, the 16th switching transistor are PMOS transistors, and the 17th switching transistor and the 18th switching transistor are NMOS transistors.

In the scan driving circuit in accordance with an embodiment of the present invention, an inverted signal of the control signal is used as cascade signals of the current stage and outputted into the scan driving circuit of the succeeding stage.

In the scan driving circuit in accordance with an embodiment of the present invention, the input control module includes a 19th switching transistor, a 20th switching transistor, a 21st switching transistor, a 22nd switching transistor, a 23rd switching transistor, and a 24th switching transistor, Wherein a control end of the 19th switching transistor is connected with an output end of the driving-signal generation module, an input end of the 19th switching transistor is connected with the constant high voltage source, and an output end of the 19th switching transistor is connected with a control end of the 21st switching transistor and a control end of the 22nd switching transistor, Wherein a control end of the 20th switching transistor is connected with the output end of the driving-signal generation module, an input end of the 20th switching transistor is connected with the constant low voltage source, and an output end of the 20th switching transistor is connected with the control end of the 21st switching transistor and the control end of the 22nd switching transistor, Wherein an input end of the 21st switching transistor is connected with the constant high voltage source, and an output end of the 21st switching transistor is connected with the control end of the 23rd switching transistor and the control end of the 24th switching transistor, Wherein an input end of the 22nd switching transistor is connected with the constant low voltage source, and an output end of the 22nd switching transistor is connected with a control end of the 23rd switching transistor and a control end of the 24th switching transistor, Wherein an input end of the 23rd switching transistor is connected with the constant high voltage source, and an output end of the 23rd switching transistor is connected with an output end of the output control module, Wherein an input end of the 24th switching transistor is connected with the constant low voltage source, and an output end of the 24th switching transistor is connected with the output end of the input control module, Wherein the 19th switching transistor, the 21st switching transistor and the 23rd switching transistor are PMOS transistors, and the 20th switching transistor, the 22nd switching transistor and the 24th switching transistor are NMOS transistors.

Compared to the conventional scan driving circuit, the scan driving circuit of the present invention drives the input control module through the cascade signals of the preceding stage and the cascade signals of the succeeding stage, so as to reduce interference and resolve the technical problem of the high dynamic power consumption of the conventional scan driving circuit.

In order to make the above-described present invention clearly comprehensible, the preferred embodiments are described below with the accompanying drawings:

DETAILED DESCRIPTION OF THE PREFERRED EMBODIMENTS

Figure 1:
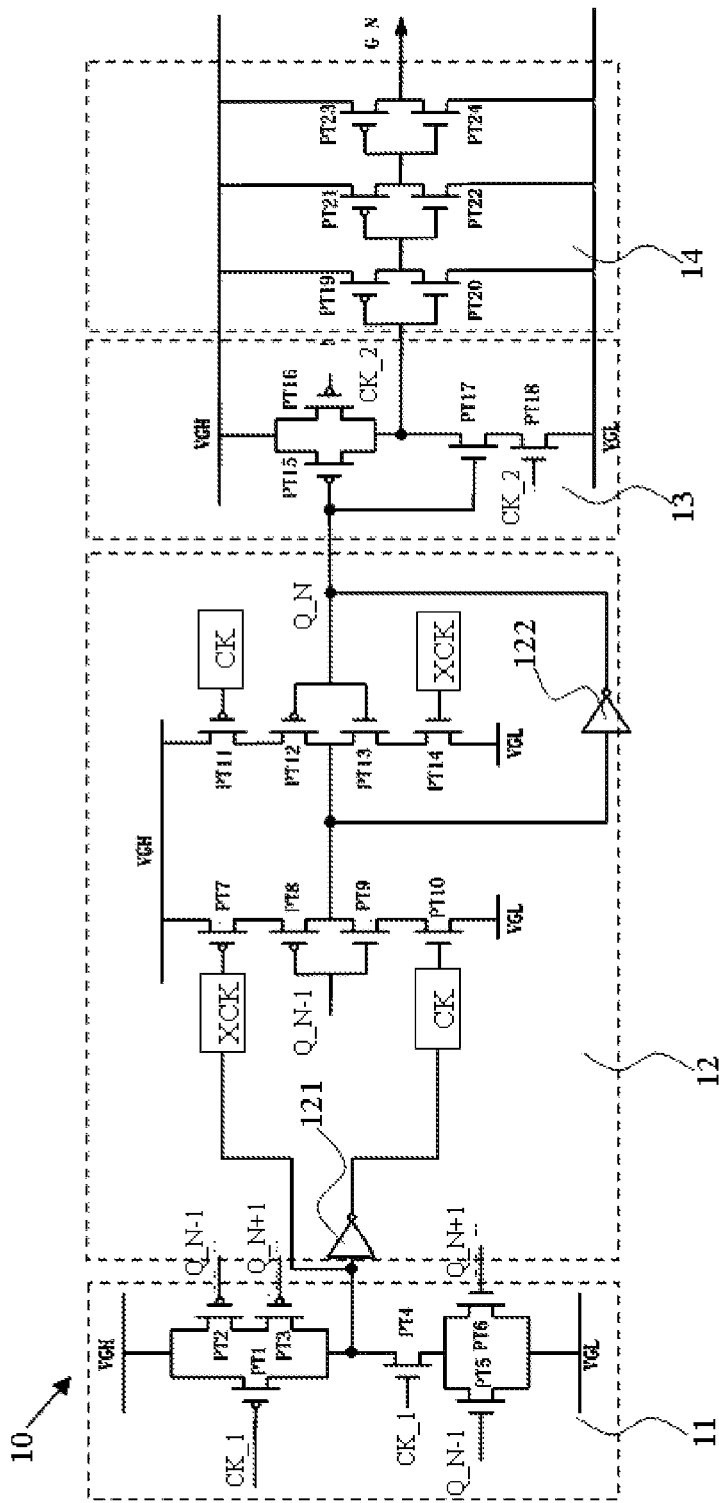
FIG. 1 is a structural schematic diagram of a scan driving circuit in accordance with a first preferred embodiment of the present invention.

The following description of the embodiments with reference to the accompanying drawings is used to illustrate particular embodiments of the present invention. The directional terms referred in the present invention, such as "upper", "lower", "front", "back", "left", "right", "inner", "outer", "side", etc. are only directions with regard to the accompanying drawings. Therefore, the directional terms used for describing and illustrating the present invention are not intended to limit the present invention.

In the drawings, units with similar structures are indicated by the same reference number.

Please refer to FIG. 1, which is a structural schematic diagram of a scan driving circuit in accordance with a first preferred embodiment of the present invention. The scan driving circuit of the present preferred embodiment is used for driving cascaded scan lines. The scan driving circuit 10 in each stage includes an input control module 11, a latch module 12, a driving-signal generation module 13, an output control module 14, a constant high voltage source VGH and a constant low voltage source VGL.

The input control module inputted with a first clock signal of a current stage, cascade signals of a preceding stage, and cascade signals of a succeeding stage, and for generating a control signal based upon the first clock signal of the current stage, the cascade signals of the preceding stage, and the cascade signals of the succeeding stage. The latch module is used for performing a latch operation for the control signal. The driving-signal generation module is used for generating a driving signal based upon the control signal and a second clock signal of the current stage. The output control module is used for outputting a scanning signal of the current stage based upon the driving signal. The constant high voltage source is used for providing high voltage. The constant low voltage source is used for providing low voltage.

The input control module 11 of the present preferred embodiment includes a 1st switching transistor PT1, a 2nd switching transistor PT2, a 3rd switching transistor PT3, a 4th switching transistor PT4, a 5th switching transistor PT5 and a 6th switching transistor PT6.

A control end of the 1st switching transistor PT1 is inputted with the first clock signal of the current stage CK_1, an input end of the 1st switching transistor PT1 is connected with the constant high voltage source VGH, and an output end of the 1st switching transistor PT1 is connected with an output end of the input control module 11.

A control end of the 2nd switching transistor PT2 is inputted with the cascade signals of the preceding stage Q_N−1, an input end of the 2nd switching transistor PT1 is connected with the constant high voltage source VGH, and an output end of the 2nd switching transistor PT2 is connected with an input end of the 3rd switching transistor PT3.

A control end of the 3rd switching transistor PT3 is inputted with the cascade signals of the succeeding stage Q_N+1, and an output end of the 3rd switching transistor PT3 is connected with the output end of the input control module 11.

A control end of the 4th switching transistor PT4 is inputted with the first clock signal of the current stage CK_1, an input end of the 4th switching transistor PT4 is connected with an output end of the 5th switching transistor PT5, and an output end of the 4th switching transistor PT4 is connected with the output end of the input control module 11.

A control end of the 5th switching transistor PT5 is inputted with the cascade signals of the preceding stage Q_N−1, and an input end of the 5th switching transistor PT5 is connected with the constant low voltage source VGL.

A control end of the 6th switching transistor PT6 is inputted with the cascade signals of the succeeding stage Q_N+1, an input end of the 6th switching transistor PT6 is connected with the constant low voltage source VGL, and an output end of the 6th switching transistor PT6 is connected with the output end of the 5th switching transistor PT5.

The latch module 12 of the present preferred embodiment includes a 1st inverter 121, a 2nd inverter 122, a 7th switching transistor PT7, an 8th switching transistor PT8, a 9th switching transistor PT9, a 10th switching transistor PT10, a 11th switching transistor PT11, a 12th switching transistor PT12, a 13th switching transistor PT13 and a 14th switching transistor PT14.

A control end of the 7th switching transistor PT7 is connected with of an output end of the input control module 11, an input end of the 7th switching transistor PT7 is connected with the constant high voltage source VGH, and an output end of the 7th switching transistor PT7 is connected with an input end of the 8th switching transistor PT8.

A control end of the 8th switching transistor PT8 is inputted with the cascade signals of the preceding stage Q_N−1, and an output end of the 8th switching transistor PT8 is connected with an output end of the latch module 12 through the 2nd inverter 122.

A control end of the 9th switching transistor PT9 is inputted with the cascade signals of the preceding stage Q_N−1, and an output of the 9th switching transistor PT9 is connected with the output end of the latch module 12 through the 2nd inverter 122.

A control end of the 10th switch PT10 is connected with the output end of the input control module 11 through the 1st inverter 121, an input end of the 10th switching transistor is connected with the constant low voltage source, and an output end of the 10th switching transistor is connected with an input end of the 9th switching transistor.

A control end of the 11th switching transistor PT11 is connected with the output end of the input control module 11 through the 1st inverter 121, an input end of the 11th switching transistor PT11 is connected with the constant high voltage source VGH, and an output end of the 11th switching transistor PT11 is connected with an input end of the 12th switching transistor PT12.

A control end of the 12th switching transistor PT12 is connected with the output end of the latch module 12, and an output end of the 12th switching transistor PT12 is connected with the output end of the latch module 12 through the 2nd inverter 122.

A control end of the 13th switching transistor PT13 is connected with the output end of the latch module 12, and an output end of the 13th switching transistor PT13 is connected with the output end of the latch module 12 through the 2nd inverter 122.

A control end of the 14th switching transistor 14 is connected with the output end of the input control module 11, an input end of the 14th switching transistor PT14 is connected with the constant low voltage source VGL, and an output end of the 14th switching transistor PT14 is connected with an input end of the 13th switching transistor PT13.

The driving-signal generation module 13 includes a 15th switching transistor PT15, a 16th switching transistor PT16, a 17th switching transistor PT17 and a 18th switching transistor PT18.

A control end of the 15th switching transistor PT15 is connected with an output end of the latch module 12, an input end of the 15th switching transistor PT15 is connected with the constant high voltage source VGH, and an output end of the 15th switching transistor PT15 is connected with an output end of the driving-signal generation module 13.

A control end of the 16th switching transistor PT16 is inputted with the second clock signal of the current stage CK_2, an input end of the 16th switching transistor PT16 is connected with the constant high voltage source VGH, and an output end of the 16th switching transistor PT16 is connected with the output end of the driving-signal generation module 13.

A control end of the 17th switching transistor PT17 is connected with an output end of the latch module 12, an input end of the 17th switching transistor PT17 is connected with an output end of the 18th switching transistor PT18, and an output end of the 17th switching transistor PT17 is connected with the output end of the driving-signal generation module 13.

A control end of the 18th switching transistor PT18 is inputted with the second clock signal of the current stage CK_2, and an input end of the 18th switching transistor PT18 is connected with the constant low voltage source VGL.

The input control module 14 of the present preferred embodiment includes a 19th switching transistor PT19, a 20th switching transistor PT20, a 21st switching transistor PT21, a 22nd switching transistor PT22, a 23rd switching transistor PT23, and a 24th switching transistor PT24.

A control end of the 19th switching transistor PT19 is connected with an output end of the driving-signal generation module 13, an input end of the 19th switching transistor PT19 is connected with the constant high voltage source VGH, and an output end of the 19th switching transistor PT19 is connected with a control end of the 21st switching transistor PT21 and a control end of the 22nd switching transistor PT22.

A control end of the 20th switching transistor PT20 is connected with the output end of the driving-signal generation module 13, an input end of the 20th switching transistor PT20 is connected with the constant low voltage source VGL, and an output end of the 20th switching transistor PT20 is connected with the control end of the 21st switching transistor PT21 and the control end of the 22nd switching transistor PT22.

An input end of the 21st switching transistor PT21 is connected with the constant high voltage source VGH, and an output end of the 21st switching transistor PT21 is connected with a control end of the 23rd switching transistor PT23 and a control end of the 24th switching transistor PT24.

An input end of the 22nd switching transistor PT23 is connected with the constant low voltage source VGL, and an output end of the 22nd switching transistor PT22 is connected with the control end of the 23rd switching transistor PT23 and the control end of the 24th switching transistor PT24.

An input end of the 23rd switching transistor PT23 is connected with the constant high voltage source VGH, and an output end of the 23rd switching transistor PT23 is connected with an output end of the output control module 14.

An input end of the 24th switching transistor PT24 is connected with the constant low voltage source VGL, and an output end of the 24th switching transistor PT24 is connected with the output end of the input control module 14.

In the present preferred embodiment, the 1st switching transistor PT1, the 2nd switching transistor PT2 and the 3rd switching transistor PT3 are PMOS transistors, and the 4th switching transistor PT4, the 5th switching transistor PT5 and the 6th switching transistor PT6 are NMOS transistors. The 7th switching transistor PT7, the 8th switching transistor PT8, the 11th switching transistor PT11 and the 12th switching transistor PT12 are PMOS transistors, and the 9th switching transistor PT9, the 10th switching transistor PT10, the 13th switching transistor PT13 and the 14th switching transistor PT14 are NMOS transistors. The 15th switching transistor PT15, the 16th switching transistor PT16 are PMOS transistors, and the 17th switching transistor PT17 and the 18th switching transistor PT18 are NMOS transistors. The 19th switching transistor PT19, the 21st switching transistor PT21 and the 23rd switching transistor PT23 are PMOS transistors, and the 20th switching transistor PT20, the 22nd switching transistor PT22 and the 24th switching transistor PT24 are NMOS transistors.

Figure 2:
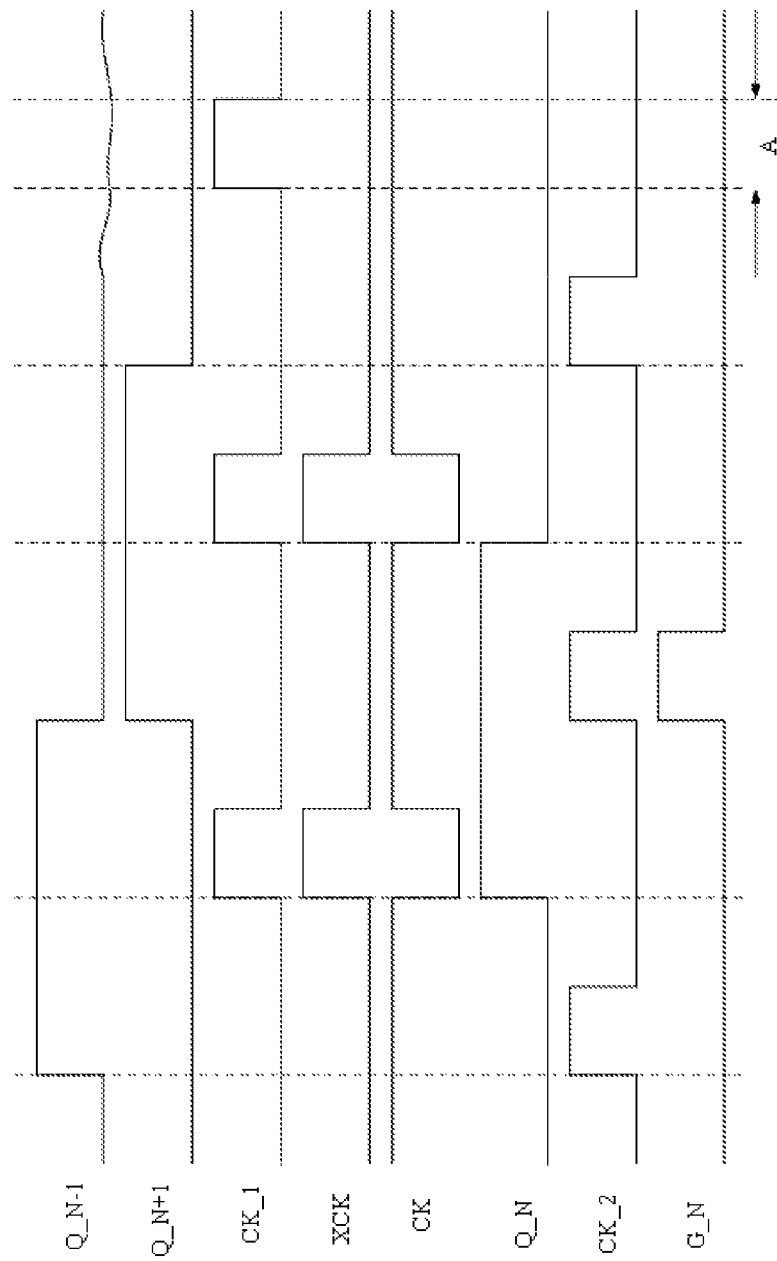
FIG. 2 is a schematic diagram of a signal waveform in accordance with a first preferred embodiment of the present invention.

For the scan the driving circuit of the preferred embodiment in use, please refer to FIG. 1 and FIG. 2. FIG. 2 is a schematic diagram of a signal waveform in accordance with a first preferred embodiment of the present invention.

When the cascade signals of the preceding stage Q_N−1 are at the high voltage, the 5th switching transistor PT5 is turned on, so that when the 4th switching transistor PT4 is turned on under the action of the first clock signal on the high voltage current stage CK_1, the output end of the input control module 11 outputs the low voltage control signal.

The low voltage control signal is transformed into the high voltage control signal CK through the 1st inverter 121, and is inputted to the control end of the 10th switching transistor PT10, while the control end of the 9th switching transistor PT9 inputs the cascade signals on the high voltage previous stage Q_N−1, so that the 9th switching transistor PT9 and 10th switching transistor PT10 are simultaneously turned on, the 8th switching transistor PT8 is turned off, and the low voltage signal of the constant low voltage source VGL is transformed into the cascade signals on the high voltage current stage Q_N through the 10th switching transistor PT10, the 9th switching transistor PT9, and the 2nd inverter 122, and is outputted from the output end of the latch module 12. The cascade signals on the high voltage current stage Q_N are simultaneously inputted to the scan driving circuit of the succeeding stage.

Then the first clock signal CK_1 is transformed into the low voltage signal. The output end of the input control module 11 outputs the high voltage control signal through the 1st switching transistor PT1.

The high voltage control signal XCK is inputted to the control end of the 14th switching transistor PT14, while the cascade signals on the high voltage current stage Q_N are inputted to the control end of the 13th switching transistor PT13, so that the 13th switching transistor PT13 and the 14th switching transistor PT14 are simultaneously turned on, the 12th switching transistor PT12 is turned off, and the high voltage signal of the constant low voltage source VGH is transformed into the cascade signals on the low voltage current stage Q_N through the 7th switching transistor PT7, the 8th switching transistor PT8, and the 2nd inverter 122, and is outputted from the output end of the latch module 12, that is, the latch operation is performed on the high voltage current stage Q_N.

When the first clock signal CK_1 is transformed into the high voltage signal again, the output end of the input control module 11 outputs the low voltage control signal again. At this time, the cascade signals on the high voltage previous stage Q_N−1 have been transformed into the low voltage. At this time, the 7th switching transistor PT7 and the 8th switching transistor PT8 are turned on. The low voltage signal of the constant low voltage source VGL is transformed into the cascade signals on the high voltage current stage Q_N through the 10th switching transistor PT10, the 9th switching transistor PT9, and the 2nd inverter 122, and is outputted from the output end of the latch module 12. The cascade signals on the low voltage current stage Q_N are simultaneously inputted to the scan driving circuit of the succeeding stage.

Then the first clock signal CK_1 is transformed into the low voltage signal. The output end of the input control module 11 outputs the high voltage control signal through the 1st switching transistor PT1.

The high voltage control signal is transformed into the low voltage control signal CK through the 1st inverter 121, and inputted to the control end of the 11th switching transistor PT11, while the cascade signals on the low voltage current stage Q_N are inputted to the control end of the 12th switching transistor PT12, so that the 11th switching transistor PT11 and the 12th switching transistor PT12 are simultaneously turned on, the 13th switching transistor PT13 is turned off, and the high voltage signal of the constant low voltage source VGH is transformed into the cascade signals on the low voltage current stage Q_N through the 11th switching transistor PT11, the 12th switching transistor PT12, and the 2nd inverter 122, and is outputted from the output end of the latch module 12, that is, the latch operation is performed on the low voltage current stage Q_N.

The driving-signal generation module 13 has the function of a NAND gate, that is, a NAND calculation is conducted on the cascade signals of the current stage Q_N inputted from the latch module 12 and the second clock signal of the current stage CK_2. Specifically, when the cascade signals of the current stage Q_N and the second clock signal of the current stage CK_2 are both at the high voltages, the 15th switching transistor PT15 and the 16th switching transistor PT16 are turned off, and the 17th switching transistor PT17 and the 18th switching transistor PT18 are turned off. Then the output end of the driving-signal generation module 13 outputs the low voltage of the constant low voltage source VGL.

When the second clock signal of the current stage CK_2 turns to the low voltage, the 18th switching transistor PT18 is turned off, the 16th switching transistor PT16 is turned on, and the output end of the driving-signal generation module 13 outputs the high voltage of the constant high voltage source VGH. When the cascade signal of the current stage Q_N 2 turn to the low voltage, the 15th switching transistor PT15 is turned on, the 17th switching transistor PT17 is turned off, and the output end of the driving-signal generation module 13 outputs the high voltage of the constant high voltage source VGH.

When the output driving signal outputted from the driving-signal generation module 13 is at high voltage, the 20th switching transistor PT20 is turned on, the 19th switching transistor PT19 is turned off, the low voltage of the constant low voltage source VGL is inputted to the control end of the 21st switching transistor PT21 and the control end of the 22nd switching transistor PT22, the 21st switching transistor PT21 is turned on, the 22nd switching transistor PT22 is turned off, the high voltage of the constant high voltage source VGH is inputted to the control end of the 23rd switching transistor PT23 and the control end of the 24th switching transistor PT24, the 23rd switching transistor PT23 is turned off, the 24th switching transistor PT24 is turned on, and the input control module 13 inputs the scan signal G_N on the low voltage current stage.

When the output driving signal outputted from the driving-signal generation module 13 is at low voltage, the 20th switching transistor PT20 is turned off, the 19th switching transistor PT19 is turned on, the high voltage of the constant high voltage source VGH is inputted to the control end of the 21st switching transistor PT21 and the control end of the 22nd switching transistor PT22, the 21st switching transistor PT21 is turned off, the 22nd switching transistor PT22 is turned on, the low voltage of the constant low voltage source VGL is inputted to the control end of the 23rd switching transistor PT23 and the control end of the 24th switching transistor PT24, the 23rd switching transistor PT23 is turned on, the 24th switching transistor PT24 is turned off, and the input control module 13 inputs the scan signal G_N on the high voltage current stage.

These steps complete the driving process of the scanning lines of the scan driving circuit in the preferred embodiment.

In the working process of the scan driving circuit in the preferred embodiment, if the noise fluctuation occurs to the cascade signals of the previous stage Q_N−1, the cascade signals of the succeeding stage Q_N+1 are in a normal state, and the final outputted scan signal G_N is not affected, specifically as shown in FIG. 2. Therefore, the scan driving circuit of the present invention drives the input control module through cascade signals of a preceding stage and cascade signals of a succeeding stage, so as to reduce interference.

Figure 3:
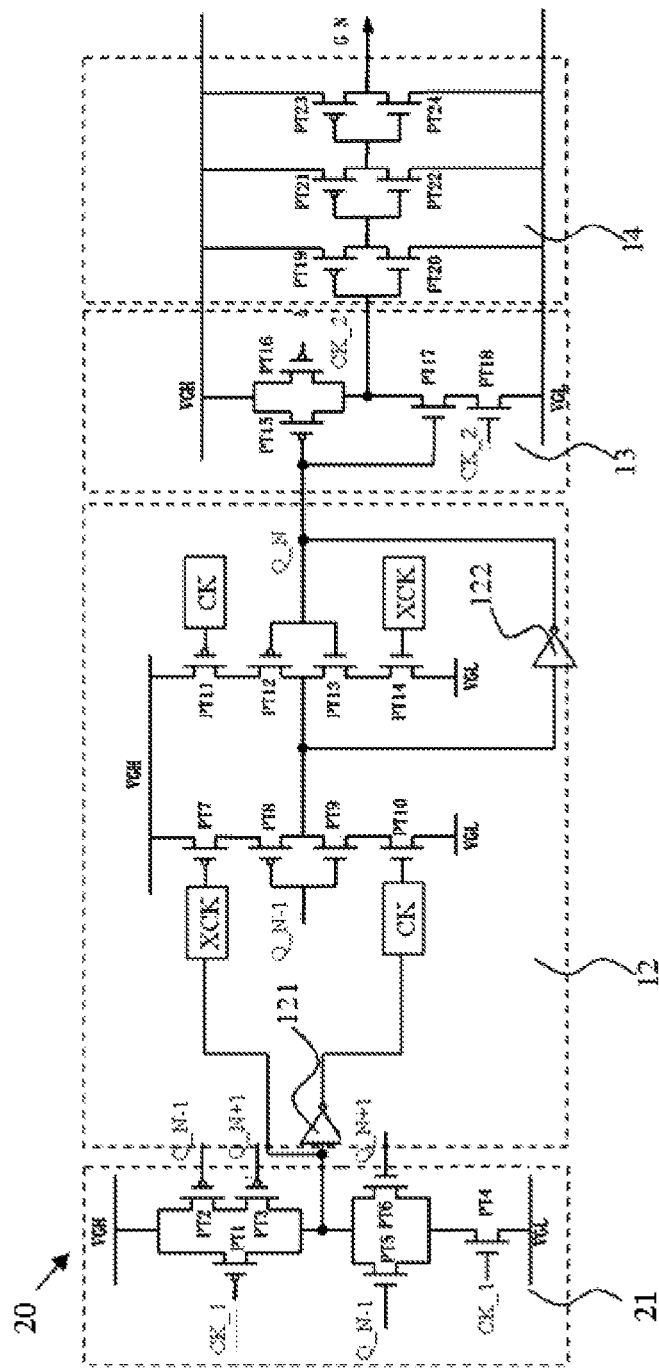
FIG. 3 is a structural schematic diagram of a scan driving circuit in accordance with a second preferred embodiment of the present invention.

Please refer to FIG. 3, which is a structural schematic diagram of a scan driving circuit in accordance with a second preferred embodiment of the present invention. On the basis of the first preferred embodiment, the input control module 21 of the scan driving circuit 20 of the present preferred embodiment includes a 1st switching transistor PT1, a 2nd switching transistor PT2, a 3rd switching transistor PT3, a 4th switching transistor PT4, a 5th switching transistor PT5 and a 6th switching transistor PT6.

A control end of the 1st switching transistor PT1 is inputted with the first clock signal of the current stage CK_1, an input end of the 1st switching transistor PT1 is connected with the constant high voltage source VGH, and an output end of the 1st switching transistor PT1 is connected with an output end of the input control module 21.

A control end of the 2nd switching transistor PT2 is inputted with the cascade signals of the preceding stage Q_N−1, an input end of the 2nd switching transistor PT2 is connected with the constant high voltage source VGH, and an output end of the 2nd switching transistor PT2 is connected with an input end of the 3rd switching transistor PT3.

A control end of the 3rd switching transistor PT3 is inputted with the cascade signals of the succeeding stage Q_N+1, and an output end of the 3rd switching transistor PT3 is connected with the output end of the input control module 21.

A control end of the 4th switching transistor PT4 is inputted with the first clock signal of the current stage CN_1, an input end of the 4th switching transistor PT4 is connected with the constant low voltage source VGL, and an output end of the 4th switching transistor PT4 is connected with an input end of the 5th switching transistor PT5.

A control end of the 5th switching transistor PT5 is inputted with the cascade signals of the preceding stage Q_N−1, and an output end of the 5th switching transistor PT5 is connected with the output end of the input control module 21.

A control end of the 6th switching transistor PT6 is inputted with the cascade signals of the succeeding stage Q_N+1, an input end of the 6th switching transistor PT6 is connected with the input end of the 5th switching transistor PT5, and the output end of the 6th switching transistor PT6 is connected with an output end of the input control module 21.

The specific working principles of the scan driving circuit 20 of the preferred embodiment is the same as or similar to the first preferred embodiment. For the details, please refer to the relevant description of the first preferred embodiment above.

Therefore, the scan driving circuit of the present preferred embodiment improves the configuration flexibility on the basis of the first preferred embodiment.

The scan driving circuit of the present invention drives the input control module through cascade signals of a preceding stage and cascade signals of a succeeding stage, so as to effectively reduce interference and resolve the technical problem of the high dynamic power consumption of the conventional scan driving circuit.

In summary, although the preferable embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A scan driving circuit configured for driving cascaded scan lines, the scan driving circuit comprising:
   an input control module inputted with a first clock signal of a current stage, cascade signals of a preceding stage, and cascades signal of a succeeding stage, and for generating a control signal based upon the first clock signal of the current stage, the cascade signals of the preceding stage, and the cascade signals of the succeeding stage;
   a latch module for performing a latch operation for the control signal;
   a driving-signal generation module for generating a driving signal based upon the control signal and a second clock signal of the current stage;
   an output control module for outputting a scanning signal of the current stage based upon the driving signal;
   a constant high voltage source for providing a high voltage; and
   a constant low voltage source for providing a low voltage,
   wherein an inverted signal of the control signal is used as cascade signals on the current stage and outputted into the scan driving circuit on the succeeding stage,
   wherein the input control module includes a 19th switching transistor, a 20th switching transistor, a 21st switching transistor, a 22nd switching transistor, a 23rd switching transistor, and a 24th switching transistor,
   wherein a control end of the 19th switching transistor is connected with an output end of the driving-signal generation module, an input end of the 19th switching transistor is connected with the constant high voltage source, and an output end of the 19th switching transistor is connected with a control end of the 21st switching transistor and a control end of the 22nd switching transistor,
   wherein a control end of the 20th switching transistor is connected with the output end of the driving-signal generation module, an input end of the 20th switching transistor is connected with the constant low voltage source, and an output end of the 20th switching transistor is connected with the control end of the 21st switching transistor and the control end of the 22nd switching transistor,
   wherein an input end of the 21st switching transistor is connected with the constant high voltage source, and an output end of the 21st switching transistor is connected with a control end of the 23rd switching transistor and a control end of the 24th switching transistor,
   wherein an input end of the 22nd switching transistor is connected with the constant low voltage source, and an output end of the 22nd switching transistor is connected with the control end of the 23rd switching transistor and the control end of the 24th switching transistor,
   wherein an input end of the 23rd switching transistor is connected with the constant high voltage source, and an output end of the 23rd switching transistor is connected with an output end of the output control module,
   wherein an input end of the 24th switching transistor is connected with the constant low voltage source, and an output end of the 24th switching transistor is connected with the output end of the input control module,
   wherein the 19th switching transistor, the 21st switching transistor and the 23rd switching transistor are PMOS transistors, and the 20th switching transistor, the 22nd switching transistor and the 24th switching transistor are NMOS transistors,
   the input control module includes a 1st switching transistor, a 2nd switching transistor, a 3rd switching transistor, a 4th switching transistor, a 5th switching transistor, and a 6th switching transistor,
   wherein a control end of the 1st switching transistor is inputted with the first clock signal of the current stage, an input end of the 1st switching transistor is connected with the constant high voltage source, and an output end of the 1st switching transistor is connected with an output end of the input control module,
   wherein a control end of the 2nd switching transistor is inputted with the cascade signals of the preceding stage, an input end of the 2nd switching transistor is connected with the constant high voltage source, and an output end of the 2nd switching transistor is connected with an input end of the 3rd switching transistor,
   wherein a control end of the 3rd switching transistor is inputted with the cascade signals on the succeeding stage, and an output end of the 3rd switching transistor is connected with the output end of the input control module,
   wherein a control end of the 4th switching transistor is inputted with the first clock signal of the current stage, an input end of the 4th switching transistor is connected with an output end of the 5th switching transistor, and an output end of the 4th switching transistor is connected with the output end of the input control module,
   wherein a control end of the 5th switching transistor is inputted with the cascade signals of the preceding stage, and an input end of the 5th switching transistor is connected with the constant low voltage source,
   wherein a control end of the 6th switching transistor is inputted with the cascade signals of the succeeding stage, an input end of the 6th switching transistor is connected with the constant low voltage source, and an output end of the 6th switching transistor is connected with the output end of the 5th switching transistor.

2. The scan driving circuit as claimed in claim 1, wherein the 1st switching transistor, the 2nd switching transistor and the 3rd switching transistor are PMOS transistors, and the 4th switching transistor, the 5th switching transistor and the 6th switching transistor are NMOS transistors.

3. The scan driving circuit as claimed in claim 1, wherein the input control module includes a 1st switching transistor, a 2nd switching transistor, a 3rd switching transistor, a 4th switching transistor, a 5th switching transistor and a 6th switching transistor,
wherein a control end of the 1st switching transistor is inputted with the first clock signal of the current stage, an input end of the 1st switching transistor is connected with the constant high voltage source, and an output end of the 1st switching transistor is connected with an output end of the input control module,
wherein a control end of the 2nd switching transistor is inputted with the cascade signals of the preceding stage, an input end of the 2nd switching transistor is connected with the constant high voltage source, and an output end of the 2nd switching transistor is connected with an input end of the 3rd switching transistor,
wherein a control end of the 3rd switching transistor is inputted with the cascade signals of the succeeding stage, and an output end of the 3rd switching transistor is connected with the output end of the input control module,
wherein a control end of the 4th switching transistor is inputted with the first clock signal of the current stage, an input end of the 4th switching transistor is connected with the constant low voltage source, and an output end of the 4th switching transistor is connected with an input end of the 5th switching transistor,
wherein a control end of the 5th switching transistor is inputted with the cascade signals of the preceding stage, and an output end of the 5th switching transistor is connected with the output end of the input control module,
wherein a control end of the 6th switching transistor is inputted with the cascade signals of the succeeding stage, an input end of the 6th switching transistor is connected with the input end of the 5th switching transistor, and an output end of the 6th switching transistor is connected with the output end of the input control module.

4. The scan driving circuit as claimed in claim 3, wherein the 1st switching transistor, the 2nd switching transistor and the 3rd switching transistor are PMOS transistors, and the 4th switching transistor, the 5th switching transistor and the 6th switching transistor are NMOS transistors.

5. The scan driving circuit as claimed in claim 1, wherein the latch module includes a 1st inverter, a 2nd inverter, a 7th switching transistor, an 8th switching transistor, a 9th switching transistor, a 10th switching transistor, a 11th switching transistor, a 12th switching transistor, a 13th switching transistor and a 14th switching transistor,
wherein a control end of the 7th switching transistor is connected with of an output end of the input control module, an input end of the 7th switching transistor is connected with the constant high voltage source, and an output end of the 7th switching transistor is connected with an input end of the 8th switching transistor,
wherein a control end of the 8th switching transistor is inputted with the cascade signals of the preceding stage, and an output end of the 8th switching transistor is connected with an output end of the latch module through the 2nd inverter;
wherein a control end of the 9th switching transistor is inputted with the cascade signals of the preceding stage, and an output of the 9th switching transistor is connected with the output end of the latch module through the 2nd inverter,
wherein a control end of the 10th switch is connected with the output end of the input control module through the 1st inverter, an input end of the 10th switching transistor is connected with the constant low voltage source, and an output end of the 10th switching transistor is connected with an input end of the 9th switching transistor,
wherein a control end of the 11th switching transistor is connected with the output end of the input control module through the 1st inverter, an input end of the 11th switching transistor is connected with the constant high voltage source, and an output end of the 11th switching transistor is connected with an input end of the 12th switching transistor,
wherein a control end of the 12th switching transistor is connected with the output end of the latch module, and an output end of the 12th switching transistor is connected with the output end of the latch module through the 2nd inverter,
wherein a control end of the 13th switching transistor is connected with the output end of the latch module, and an output end of the 13th switching transistor is connected with the output end of the latch module through the 2nd inverter,
wherein a control end of the 14th switching transistor is connected with the output end of the input control module, an input end of the 14th switching transistor is connected with the constant low voltage source, and an output end of the 14th switching transistor is connected with an input end of the 13th switching transistor.

6. The scan driving circuit as claimed in claim 5, wherein the 7th switching transistor, the 8th switching transistor, the 11th switching transistor and the 12th switching transistor are PMOS transistors, and the 9th switching transistor, the 10th switching transistor, the 13th switching transistor and the 14th switching transistor are NMOS transistors.

7. The scan driving circuit as claimed in claim 1, wherein the driving-signal generation module includes a 15th switching transistor, a 16th switching transistor, a 17th switching transistor and a 18th switching transistor,
wherein a control end of the 15th switching transistor is connected with an output end of the latch module, an input end of the 15th switching transistor is connected with the constant high voltage source, and an output end of the 15th switching transistor is connected with an output end of the driving-signal generation module,
wherein a control end of the 16th switching transistor is inputted with the second clock signal of the current stage, an input end of the 16th switching transistor is connected with the constant high voltage source, and an output end of the 16th switching transistor is connected with the output end of the driving-signal generation module,
wherein a control end of the 17th switching transistor is connected with the output end of the latch module, an input end of the 17th switching transistor is connected with an output end of the 18th switching transistor, and an output end of the 17th switching transistor is connected with the output end of the driving-signal generation module,
wherein a control end of the 18th switching transistor is inputted with the second clock signal of the current stage, and an input end of the 18th switching transistor is connected with the constant low voltage source.

8. The scan driving circuit as claimed in claim 7, the 15th switching transistor, the 16th switching transistor are PMOS transistors, and the 17th switching transistor and the 18th switching transistor are NMOS transistors.

9. A scan driving circuit configured for driving cascaded scan lines, the scan driving circuit comprising:
   an input control module inputted with a first clock signal of a current stage, cascade signals of a preceding stage, and cascade signals of a succeeding stage, and for generating a control signal based upon the first clock signal of the current stage, the cascade signals of the preceding stage, and the cascade signals of the succeeding stage;
   a latch module for performing a latch operation for the control signal;
   a driving-signal generation module for generating a driving signal based upon the control signal and a second clock signal of the current stage;
   an output control module for outputting a scanning signal of the current stage based upon the driving signal;
   a constant high voltage source for providing high voltage; and
   a constant low voltage source for providing low voltage,
   wherein the input control module includes a 1st switching transistor, a 2nd switching transistor, a 3rd switching transistor, a 4th switching transistor, a 5th. switching transistor, and a 6th switching transistor,
   wherein a control end of the 1st switching transistor is inputted with the first clock signal of the current stage, an input end of the 1st switching transistor is connected with the constant high voltage source, and an output end of the 1st switching transistor is connected with an output end of the input control module,
   wherein a control end of the 2nd switching transistor is inputted with the cascade signals of the preceding stage, an input end of the 2nd switching transistor is connected with the constant high voltage source, and an output end of the 2nd switching transistor is connected with an input end of the 3rd switching transistor,
   wherein a control end of the 3rd switching transistor is inputted with the cascade signals of the succeeding stage, and an output end of the 3rd switching transistor is connected with the output end of the input control module,
   wherein a control end of the 4th switching transistor is inputted with the first clock signal of the current stage, an input end of the 4th switching transistor is connected with an output end of the 5th switching transistor, and an output end of the 4th switching transistor is connected with the output end of the input control module,
   wherein a control end of the 5th switching transistor is inputted with the cascade signals of the preceding stage, and an input end of the 5th switching transistor is connected with the constant low voltage source,
   wherein a control end of the 6th switching transistor is inputted with the cascade signals of the succeeding stage, an input end of the 6th switching transistor is connected with the constant low voltage source, and an output end of the 6th switching transistor is connected with the output end of the 5th switching transistor.

10. The scan driving circuit as claimed in claim 9, wherein the 1st switching transistor, the 2nd switching transistor and the 3rd switching transistor are PMOS transistors, and the 4th switching transistor, the 5th switching transistor and the 6th switching transistor are NMOS transistors.

11. The scan driving circuit as claimed in claim 9, wherein the input control module includes a 1st switching transistor, a 2nd switching transistor, a 3rd switching transistor, a 4th switching transistor, a 5th switching transistor and a 6th switching transistor,
   wherein a control end of the 1st switching transistor is inputted with the first clock signal of the current stage, an input end of the 1st switching transistor is connected with the constant high voltage source, and an output end of the 1st switching transistor is connected with an output end of the input control module,
   wherein a control end of the 2nd switching transistor is inputted with the cascade signals of the preceding stage, an input end of the 2nd switching transistor is connected with the constant high voltage source, and an output end of the 2nd switching transistor is connected with an input end of the 3rd switching transistor,
   wherein a control end of the 3rd switching transistor is inputted with the cascade signals of the succeeding stage, and an output end of the 3rd switching transistor is connected with the output end of the input control module,
   wherein a control end of the 4th switching transistor is inputted with the first clock signal of the current stage, an input end of the 4th switching transistor is connected with the constant low voltage source, and an output end of the 4th switching transistor is connected with an input end of the 5th switching transistor,
   wherein a control end of the 5th switching transistor is inputted with the cascade signals of the preceding stage, and an output end of the 5th switching transistor is connected with the output end of the input control module,
   wherein a control end of the 6th switching transistor is inputted with the cascade signals of the succeeding stage, an input end of the 6th switching transistor is connected with the input end of the 5th switching transistor, and an output end of the 6th switching transistor is connected with the output end of the input control module.

12. The scan driving circuit as claimed in claim 11, wherein the 1st switching transistor, the 2nd switching transistor and the 3rd switching transistor are PMOS transistors, and the 4th switching transistor, the 5th switching transistor and the 6th switching transistor are NMOS transistors.

13. The scan driving circuit as claimed in claim 9, wherein the latch module includes a 1st inverter, a 2nd inverter, a 7th switching transistor, an 8th switching transistor, a 9th switching transistor, a 10th switching transistor, a 11th switching transistor, a 12th switching transistor, a 13th switching transistor and a 14th switching transistor,
   wherein a control end of the 7th switching transistor is connected with of an output end of the input control module, an input end of the 7th switching transistor is connected with the constant high voltage source, and an output end of the 7th switching transistor is connected with an input end of the 8th switching transistor,
   wherein a control end of the 8th switching transistor is inputted with the cascade signals of the preceding stage, and an output end of the 8th switching transistor is connected with an output end of the latch module through the 2nd inverter,
wherein a control end of the 9th switching transistor is inputted with the cascade signals of the preceding stage, and an output of the 9th switching transistor is connected with the output end of the latch module through the 2nd inverter;
wherein a control end of the 10th switch is connected with the output end of the input control module through the 1st inverter, an input end of the 10th switching transistor is connected with the constant low voltage source, and an output end of the 10th switching transistor is connected with an input end of the 9th switching transistor;
wherein a control end of the 11th switching transistor is connected with the output end of the input control module through the 1st inverter, an input end of the 11th switching transistor is connected with the constant high voltage source, and an output end of the 11th switching transistor is connected with an input end of the 12th switching transistor;
wherein a control end of the 12th switching transistor is connected with the output end of the latch module, and an output end of the 12th switching transistor is connected with the output end of the latch module through the 2nd inverter;
wherein a control end of the 13th switching transistor is connected with the output end of the latch module, and an output end of the 13th switching transistor is connected with the output end of the latch module through the 2nd inverter;
wherein a control end of the 14th switching transistor is connected with the output end of the input control module, an input end of the 14th switching transistor is connected with the constant low voltage source, and an output end of the 14th switching transistor is connected with an input end of the 13th switching transistor.

14. The scan driving circuit as claimed in claim 13, wherein the 7th switching transistor, the 8th switching transistor, the 11th switching transistor and the 12th switching transistor are PMOS transistors, and the 9th switching transistor, the 10th switching transistor, the 13th switching transistor and the 14th switching transistor are NMOS transistors.

15. The scan driving circuit as claimed in claim 9, wherein the driving-signal generation module includes a 15th switching transistor, a 16th switching transistor, a 17th switching transistor and a 18th switching transistor;
wherein a control end of the 15th switching transistor is connected with an output end of the latch module, an input end of the 15th switching transistor is connected with the constant high voltage source, and an output end of the 15th switching transistor is connected with an output end of the driving-signal generation module;
wherein a control end of the 16th switching transistor is inputted with the second clock signal of the current stage, an input end of the 16th switching transistor is connected with the constant high voltage source, and an output end of the 16th switching transistor is connected with the output end of the driving-signal generation module,
wherein a control end of the 17th switching transistor is connected with the output end of the latch module, an input end of the 17th switching transistor is connected with an output end of the 18th switching transistor, and an output end of the 17th switching transistor is connected with the output end of the driving-signal generation module,
wherein a control end of the 18th switching transistor is inputted with the second clock signal of the current stage, and an input end of the 18th switching transistor is connected with the constant low voltage source.

16. The scan driving circuit as claimed in claim 15, wherein the 15th switching transistor, the 16th switching transistor are PMOS transistors, and the 17th switching transistor and the 18th switching transistor are NMOS transistors.

17. The scan driving circuit as claimed in claim 9, wherein an inverted signal of the control signal is used as cascade signals of the current stage and outputted into the scan driving circuit of the succeeding stage.

18. The scan driving circuit as claimed in claim 9, wherein the input control module includes a 19th switching transistor, a 20th switching transistor, a 21st switching transistor, a 22nd switching transistor, a 23rd switching transistor, and a 24th switching transistor,
wherein a control end of the 19th switching transistor is connected with an output end of the driving-signal generation module, an input end of the 19th switching transistor is connected with the constant high voltage source, and an output end of the 19th switching transistor is connected with a control end of the 21st switching transistor and a control end of the 22nd switching transistor,
wherein a control end of the 20th switching transistor is connected with the output end of the driving-signal generation module, an input end of the 20th switching transistor is connected with the constant low voltage source, and an output end of the 20th switching transistor is connected with the control end of the 21st switching transistor and the control end of the 22nd switching transistor,
wherein an input end of the 21st switching transistor is connected with the constant high voltage source, and an output end of the 21st switching transistor is connected with a control end of the 23rd switching transistor and a control end of the 24th switching transistor,
wherein an input end of the 22nd switching transistor is connected with the constant low voltage source, and an output end of the 22nd switching transistor is connected with the control end of the 23rd switching transistor and the control end of the 24th switching transistor,
wherein an input end of the 23rd switching transistor is connected with the constant high voltage source, and an output end of the 23rd switching transistor is connected with an output end of the output control module,
wherein an input end of the 24th switching transistor is connected with the constant low voltage source, and an output end of the 24th switching transistor is connected with the output end of the input control module,
wherein the 19th switching transistor, the 21st switching transistor and the 23rd switching transistor are PMOS transistors, and the 20th switching transistor, the 22nd switching transistor and the 24th switching transistor are NMOS transistors.

* * * * *

UNITED STATES PATENT AND TRADEMARK OFFICE
CERTIFICATE OF CORRECTION

| | | |
|---|---|---|
| PATENT NO. | : 9,628,050 B2 | Page 1 of 1 |
| APPLICATION NO. | : 14/783100 | |
| DATED | : April 18, 2017 | |
| INVENTOR(S) | : Mang Zhao et al. | |

It is certified that error appears in the above-identified patent and that said Letters Patent is hereby corrected as shown below:

On the Title Page

Item (30) Foreign Application Priority Data

Insert the following:

--Jul. 2, 2015 (CN)..............2015 1 0386937.1--

Signed and Sealed this
Third Day of October, 2017

Joseph Matal
*Performing the Functions and Duties of the
Under Secretary of Commerce for Intellectual Property and
Director of the United States Patent and Trademark Office*